United States Patent [19]

Petitjean et al.

[11] Patent Number: 4,922,235
[45] Date of Patent: May 1, 1990

[54] ENCODING DEVICE FOR MULTIPLE CONSECUTIVE POSITION DETECTION

[75] Inventors: Gilbert Petitjean, Igny; Michel Lebourg, Clamart, both of France

[73] Assignee: U.S. Philips Corporation, New York, N.Y.

[21] Appl. No.: 295,715

[22] Filed: Jan. 10, 1989

[30] Foreign Application Priority Data

Jan. 15, 1988 [FR] France ................. 88 00431

[51] Int. Cl.$^5$ ................. G08B 21/00; H01H 9/06
[52] U.S. Cl. ................. 340/686; 200/61.85
[58] Field of Search ............ 340/686, 688, 825.65; 200/61.41, 61.42, 61.85

[56] References Cited

U.S. PATENT DOCUMENTS

| | | | |
|---|---|---|---|
| 2,902,685 | 9/1959 | Davis | 340/870.27 X |
| 3,050,718 | 8/1962 | Giel | 340/870.44 X |
| 3,465,331 | 9/1969 | Trötscher | 377/3 X |
| 4,459,115 | 7/1984 | Ballard | 340/689 X |
| 4,493,155 | 1/1985 | Comeau et al. | 33/366 |
| 4,567,763 | 2/1986 | Schiffbauer | 340/688 X |
| 4,719,445 | 1/1988 | Fremd | 340/686 X |
| 4,728,923 | 3/1988 | Finger | 340/686 X |

FOREIGN PATENT DOCUMENTS 2247777  3/1975  Fed. Rep. of Germany .

OTHER PUBLICATIONS

Electronique Industrielle, No. 136, Sep. 1970, pp. 511–516.

*Primary Examiner*—Joseph A. Orsino
*Assistant Examiner*—Thomas J. Mullen, Jr.
*Attorney, Agent, or Firm*—David R. Treacy

[57] ABSTRACT

A device for marking, for example, the position of a control knob, comprising an arrangement with several terminals each of which corresponds to one of the positions, the application of a DC voltage (+V) at each instant to one and only one of the terminals indicating the presence of the knob in the corresponding position. The device includes a series of operational amplifiers having specified gain, each amplifier having its inverting input connected to one of the terminals and its non-inverting input connected to the terminal corresponding to the next position. Each terminal is connected to a circuit for taking those terminals, which do not correspond to the momentary position of the knob, to a specified voltage. The outputs of the amplifiers are connected to a detection circuit for detecting on one of them any transition whose amplitude exceeds a specified threshold and to control a count-up/count-down device whose output value is incremented or decremented depending on the direction of the transition, this output value constituting an indication of the position of the knob.

20 Claims, 3 Drawing Sheets

ENCODING DEVICE FOR MULTIPLE CONSECUTIVE POSITION DETECTION

BACKGROUND OF THE INVENTION

The invention relates to a device for providing a value indicating the position of an object which can occupy at least three consecutive positions, comprising an arrangement with several terminals each of which corresponding to one of the positions, the application of a DC voltage at each instant on one and only one of the said terminals indicating the presence of an object in the corresponding position.

Such devices are used for example for transmitting the position of a moving body to a display unit, for example the position of a vane, or for transmitting the position of a control device, for example a rotary knob, or a hand operated multi-contact slider, to a device to be controlled.

Known electromechanical devices are constituted of mechanical displacement detectors (cams, ratchets, Maltese crosses, etc. . . . ), operating electrical contacts. These devices are generally bulky, not very reliable and only accept low displacement speeds.

There are also optical encoders formed from a light source (generally light emitting diodes), photodetectors and a focusing system. These optical sensors, without contacts, are very widely used. They are rather bulky and cannot be used in equipment in which the operating temperature limits are very severe.

Phase shifting electromechanical devices are based on systems (sine-cosine potentiometers, resolvers, etc.) delivering signals which are phase-shifted as a function of the direction of rotation. These special components are bulky, of limited lifetime and are relatively costly.

A device using temporal analysis by microprocessor could be envisaged. But the embodiment of this device would be complex, taking account of the large number of states to be tested, for transition times in the order of a few milliseconds.

Encoding devices are normally of two types: either "short-circuiting", i.e. when passing from one position to the next, two positions are momentarily indicated simultaneously, or "non-short-circuiting" in which case there is a break of continuity between two positions. In order to avoid this, the document U.S. Pat. No. 2,902,685 recommends the use of displays with a trigger voltage higher than their operating voltage, in series with a resistor which is common to all of the displays such that the switching on of one of them makes the voltage drop and prevents the triggering of a second one, which prevents the display of two positions at the same time with a short-circuiting type encoder. Similar results could easily be obtained with threshold semiconductor flip-flops.

Document DE-P-2,247,777 describes a device which can obtain the same result using non-short-circuiting sensors: R/S flip-flops record a position and store it during the time of transition from one position to the next.

With these two solutions, a voltage on a terminal which corresponds to one position can be applied at each instant to one and only one of the said terminals. The words "at each instant" means that at no time can the situation in which no voltage would be applied to at least one of the terminals arise: this of course ignores the intrinsic transition times of the electronic circuits used.

SUMMARY OF THE INVENTION

The invention proposes to provide a device enabling the transmission of a position indication which is of small volume, of low consumption, very reliable and can operate over a wide temperature range.

All of these objectives are obtained because of the fact that:

the device comprises a series of operational amplifiers with specified gain, each provided with an inverting input and a non-inverting input and working over a range of voltages situated between a more positive limit voltage and a more negative limit voltage with respect to an intermediate voltage, the difference between the above mentioned DC voltage on a terminal of the arrangement and the intermediate voltage being large enough for the application of this difference between the two inputs of an amplifier to practically take the output of the latter to one of the limit voltages, each amplifier has its inverting input connected to one of the terminals corresponding to one position, and its non-inverting input connected to the terminal corresponding to the next position, each terminal is provided with means for taking the terminals, which do not correspond to the momentary position of the object, to the intermediate voltage, the outputs of the amplifiers are connected to a detection circuit for detecting on one of them any transition whose amplitude exceeds a determined threshold and for then delivering a signal indicating the direction of the transition, and this signal is used to control a count-up/count-down device whose output value is incremented or decremented on each signal depending on the direction of the transition, this output value constituting an indication of the position of the object.

In the frequent case in which the positions of the object form a closed loop, i.e. the first position follows the last position and the same applies for the terminals, the device advantageously comprises an amplifier whose inverting input is connected to the last terminal and whose non-inverting input is connected to the first terminal. Thus the series of amplifiers also forms a closed loop. In such a case, the invention provides the advantage that the value supplied by the device can be larger than the number of positions of the object, and is only limited by the capacity of the count-up/count-down device.

The device to be controlled can, for example, be the radio transmitter-receiver of an aircraft. It is useful if the pilot can select a preset channel (0 to 99 for example) without having to look at the control knob. It is therefore particularly advantageous to be able to quickly select one of these channels by carrying out several rotations of a multi-contact selector (having 12 or 16 positions for example which correspond to what was referred to above as the "position of the object") and to read the channel number on a repeater located on the instrument panel. A push-button (coaxial with the selector) can, in addition, enable a fast return to the zero position (zero reset).

In these conditions, the position data generated by the position detector are sent in digitally encoded form to the transmitter-receiver for switching the corresponding preset frequencies, and also to the display device in order to display the number of the chosen channel.

In the case in which the number of positions of the object is n which is a multiple of a number j, and can therefore be grouped in j sets of i successive positions, with $i \times j = n$, it is therefore advantageous that the arrangement comprises only i terminals, each of them corresponding to a same position in each of the j sets, the application of the DC voltage on one of the i terminals indicating the presence of the object in the corresponding position of one of the j sets. Thus, a great saving in the number of amplifiers is achieved.

In an advantageous embodiment of the arrangement provided with terminals, it comprises a rotary non-short-circuiting selector, followed by locking flip-flops ("latches"), whose output is connected each time to one of the terminals. Furthermore, if the number of positions is not a prime number, the number of terminals can advantageously be a divisor of the number of positions.

Because of the fact that the connection of each terminal to the output of a flip-flop can have the result that the terminals corresponding to positions other than that of the object are taken to an unwanted voltage, the terminals which do not correspond to the position of the object are taken to the intermediate voltage by means of resistors connected between each of the terminals and the intermediate voltage source, associated with diodes connected between each latch output and the corresponding terminal.

In an advantageous embodiment, the detection circuit for detecting the transitions has as many inputs as there are terminals, each input is connected via a capacitor on the one hand to one end of a resistor whose other end is connected to a reference potential point, on the other hand to the cathode of a first zener diode and to the anode of a second zener diode, all of the first diodes have their anodes connected together, their common point being connected to ground via a resistor, and all of the second diodes have their cathodes connected together, their common point being connected to ground via a resistor.

This embodiment enables satisfactory operation to be obtained even if the response times of the amplifiers are different from each other.

In one embodiment of the control circuit of the count-up/count-down device, one of the common points is connected via a capacitor to the inverting input of a first comparator, and the other is connected in the same way to the non-inverting input of a second comparator, these comparators being biased such that their outputs are in the same state when in the rest state. These outputs are each connected to one input of an R/S flip-flop which stores the direction of the transition, and whose output is applied to the input controlling the direction of counting of the count-up/count-down device. The control circuit comprises a comparator assembly which delivers a pulse when one or other of the common points delivers a signal, the pulse being identical in both cases and applied to the clock input of the count-up/count-down device.

The following description, given with reference to the appended drawings describing non-limitative examples will give a good understanding of how the invention may be embodied.

DESCRIPTION OF THE PREFERRED EMBODIMENTS

Figure 1:
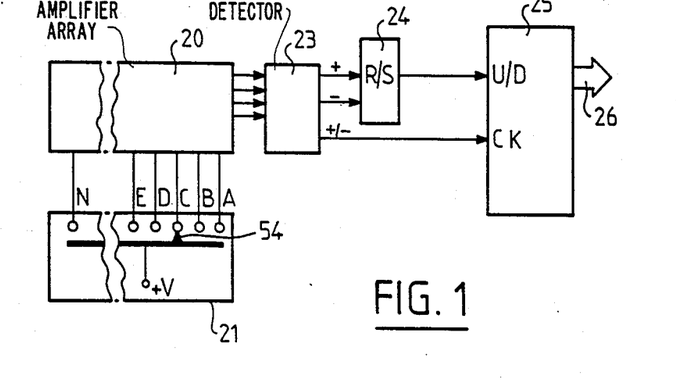
FIG. 1 is an overall block diagram of a device according to the invention.

In the block diagram of FIG. 1, the block 21 represents an arrangement with several terminals A, B, C, ..., N, each of which corresponds to one of the consecutive positions of an object. It symbolically contains a switch with a moving contact element 54, to which is applied a DC voltage $+V$ which is taken to one of the terminals by the contact element, the position of the latter corresponding to that of the object. This voltage is applied at each instant to one and only one of the terminals: by this it is understood that the slider 54 is considered as passing instantaneously from one position to another. This is of course almost impossible to achieve mechanically, but can nevertheless be obtained by means of an electronic circuit placed after a mechanical switch. An example of such a circuit will be described below, with reference to a detailed example of embodiment of the invention.

The terminals are connected to an element 20 which symbolizes a circuit for detecting a passage of the voltage $+V$ from one terminal to another. This element contains a series of amplifiers whose connection will be explained in greater detail below and whose outputs are taken to a detection circuit 23 which detects any transition whose amplitude exceeds a determined threshold. When such a transition occurs, this circuit delivers a short signal, either on an output "+", or on an output "−", to indicate the direction of the transition. It also delivers a short signal "+/−" which is independent of the direction of transition. The connections taking the short signals "+" or "−" are taken to an R/S flip-flop 24 for storing the direction of the transition. Finally the output of this flip-flop 24 is applied to the input controlling the direction of counting of a count-up/count-down device 25, and the signal "+/−" is taken to its clock input. The count value of this device is therefore incremented or decremented on each transition depending on the direction of the transition. This count value is supplied digitally on a multi-wire conductor 26. It represents a position of the object.

Figure 2:
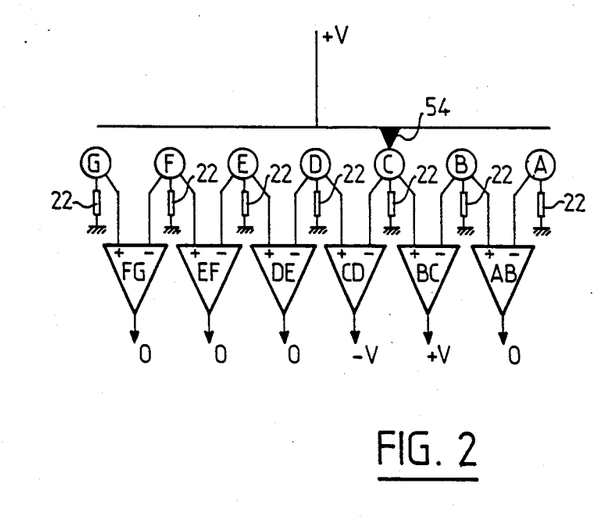
FIG. 2 is a diagrammatic representation of part of a device for illustrating the basic principle of the invention.

The connection of the series of amplifiers is shown in FIG. 2. Each of them is an operational amplifier: this means that it is provided with two inputs, one an inverting input and the other a non-inverting input, and that a same voltage variation applied to both inputs at the same time causes practically no effect on the output voltage. Futhermore these amplifiers have a specified gain: this means that if for example they are embodied by means of integrated circuit operational amplifiers, the latter are provided with a feedback loop for limiting their gain. These amplifiers are fed by a voltage source which enables their output to vary between a more positive limit voltage and a more negative limit voltage with respect to an intermediate voltage. These limit voltages can respectively be a positive voltage $+V$ and a negative voltage $-V$ with respect to ground, or one of the limit voltages can be that of ground and the intermediate voltage can be approximately equal to half of the other limit voltage.

In the example of FIG. 2, which corresponds to the first of the two above cases, each terminal A, B, . . . G is connected to the intermediate voltage source, i.e. ground, via a resistor 22. Thus the terminals which do not correspond to the momentary position of the object are taken to the intermediate voltage.

The DC voltage applied to a terminal is here +V. It could also be −V, the essential fact being that the difference between this voltage and the intermediate voltage is large enough for the application of this difference between the two inputs of an amplifier to practically take the output of the latter to one of the limit voltages.

The amplifier AB has its inverting (−) input connected to the terminal A and its non-inverting (+) input connected to the terminal B which corresponds to the next position of the object. The same description respectively applies to all of the amplifiers by changing the reference letters.

The contact element 54, or in practice its electronic equivalent which will be described below, is here on terminal C, thus taken to the voltage +V. The terminals B and D are connected to the intermediate voltage via the resistors 22. The output of the amplifier CD is therefore at −V, and that of BC is at +V. The other amplifiers, AB, DE, EF, FG all have both of their inputs taken to the intermediate voltage together. As the amplifiers are provided with a feedback loop to limit their gain, a small spurious difference between the voltages of two inputs cannot have much effect on the output voltage. This output voltage is therefore approximately equal to the intermediate voltage. The output voltages are therefore respectively, from right to left: 0, +V, −V, 0, 0, 0. Let us assume that the contact 54 now passes from C to D. The output voltages now respectively become, still from right to left: 0, 0, +V, −V, 0, 0. Three transitions have taken place on the outputs: that of BC has changed from +V to 0, that of CD has changed from −V to +V, and that of DE has changed from 0 to −V.

There is therefore a "big" transition −V/+V and two "small" transitions 0/−V or +V/0.

If the contact 54 passes from C to B, the output voltages respectively become +V, −V, 0, 0, 0, 0. The passage from C to B therefore causes a transition 0/+V for AB, +V/−V for BC, −V/0 for CD.

If we only consider the "big" transition, it can be stated that it is positive for the passage of C to D, and negative for the passage from C to B. Its direction therefore indicates the direction of displacement of the object no matter on which of the amplifiers it was produced.

This comment is the basis of the invention. In order to detect the "big" transitions and to ignore the "small" transitions, it suffices to detect any transition whose amplitude exceeds a specified threshold, a threshold whose value is in this case between one and two times V.

The object whose position must be indicated by a value is most often a control device which is operated by hand and whose position controls a remote device. The terminals of FIG. 2 correspond for example to a linear slider control lever. In other cases, the control is carried out using a rotary knob. This is the case to which the device of FIG. 3 corresponds, which comprises four terminals A, B, C, D forming a closed loop, i.e. the first position A follows the last position D and the same of course applies for the positions of the object. With the terminals A, B, C, D in line as in FIG. 2, the device would comprise the amplifiers AB, BC, CD. In this case it comprises the additional amplifier DA whose inverting (−) input is connected to the last terminal D, and whose non-inverting (+) input is connected to the first terminal A.

Figure 3:
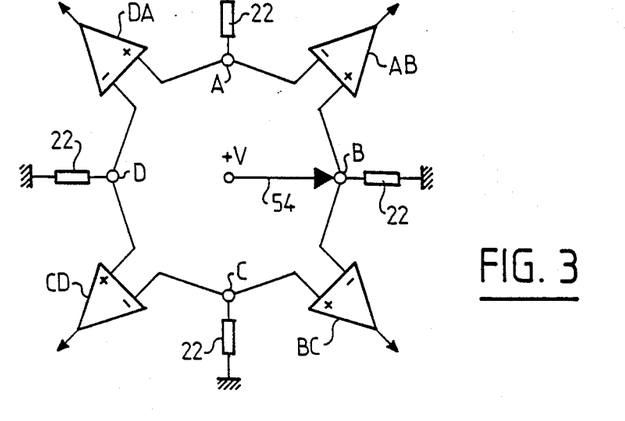
FIG. 3 shows a variant of the same section of a device.

It follows that all of the + and − inputs could be reversed without changing any part of the functioning. It would therefore suffice to list the terminals in the reverse direction in order to return to the same definition.

With the diagram of FIG. 3, the functioning has an advantageous feature: the contact element 54 can make as many turns as desired. Assuming for example that it always moves in the same direction, this series of amplifiers delivers a series of pulses which are completely identical, while the element 54 continues to rotate, and the number of transitions can be much higher than the number of terminals. This feature is very advantageous as it is possible with such a device to provide a value corresponding to a number of positions of the object which is much larger than the number of positions of the switch 54, this value being limited only by the capacity of the counter 25.

Figure 4:
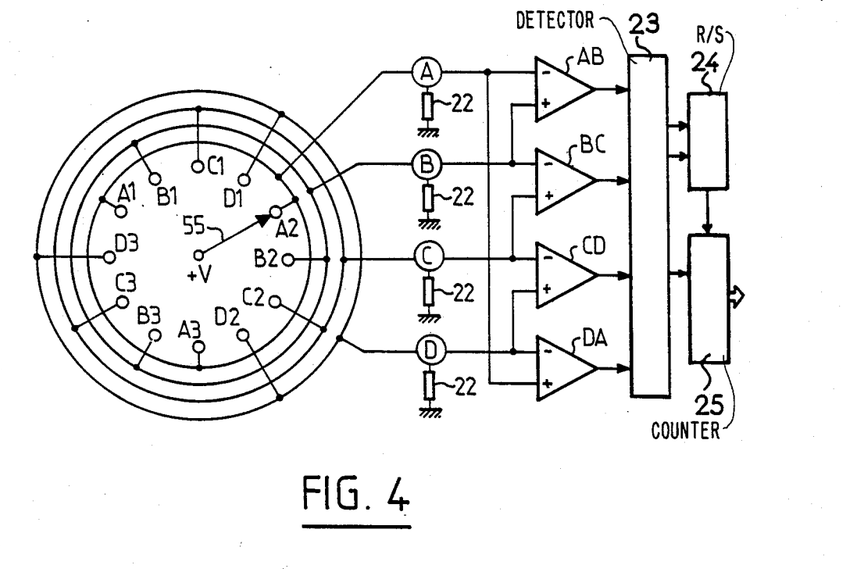
FIG. 4 shows an improved variant.

In addition it may be required to use a rotary knob which includes a larger number of positions than that shown in FIG. 3, for example in order to enable a more convenient use, the angle of rotation necessary for passing from one position to another then being smaller. The diagram in FIG. 4 is therefore advantageous: it enables the device to be produced with only four terminals and four amplifiers, while the rotary knob 55 here comprises 12 positions corresponding to 12 positions of the object. The first position A1 is connected to the fifth position A2 and to the ninth position A3, and similarly the positions B1, B2, B3 are connected to each other as are the positions C1, C2, C3.

Similarly a number n of knob positions could be provided which is any multiple j of the number i of terminals. In this case the arrangement comprises only i terminals, each of them corresponding to a same position in each of the j sets, the application of the said voltage on one of the i terminals indicating the presence of the object at the corresponding position of any of the j sets. For example, a voltage on terminal A indicates the presence of the cursor 55 at A1, or A2, or A3. The doubt between these three positions can be removed if the movement of the knob has been followed step by step starting from a known start position.

If there is no stop for the slider, several rotations of the knob are permitted and it is then necessary to provide a device for resetting the counter 25 to zero, the start position being that in which the knob is located at the time of the zero reset.

The devices of FIGS. 3 or 4 could also be imagined with only three terminals. However for practical reasons of positioning angle (90°, 45°, 30°) of current 4, 8 or 12-position rotary switches, the preferred number of terminals is four. The electrical circuit used in practice can therefore comprise a switch whose number of positions is a multiple of four.

Figure 5:
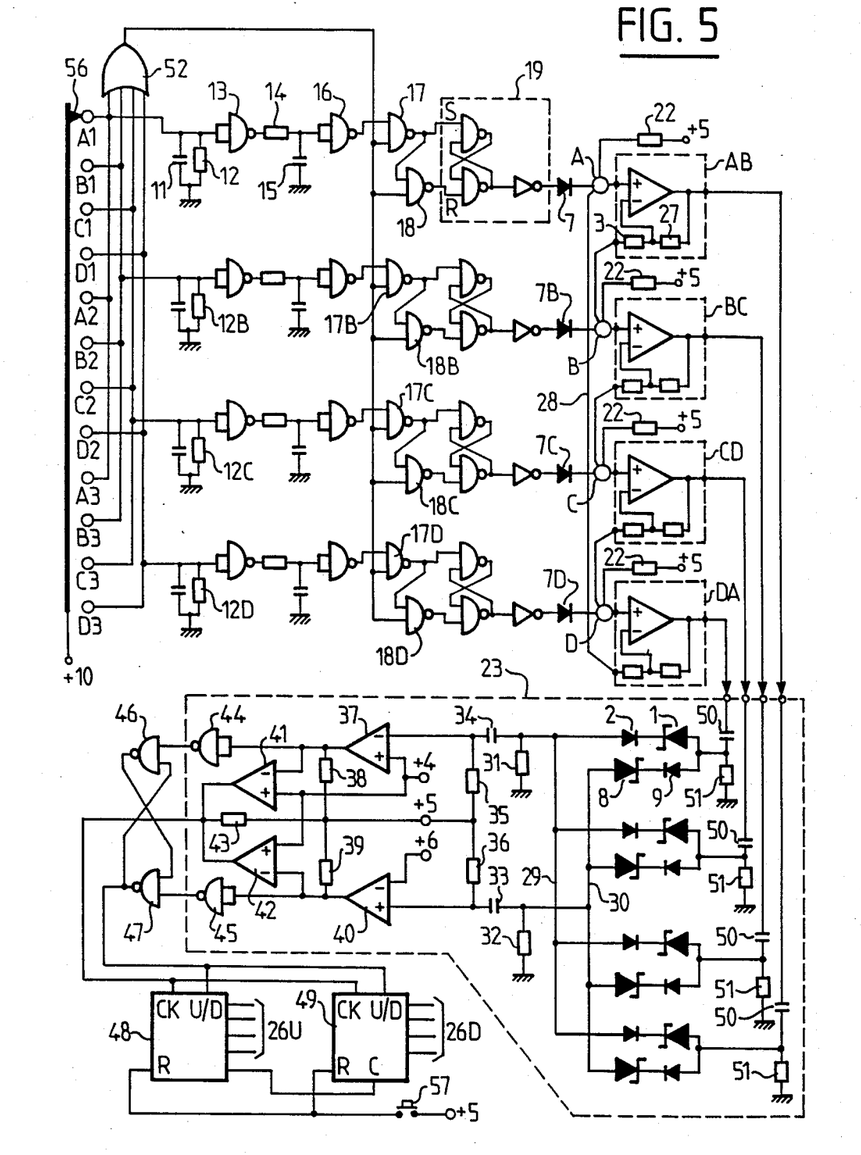
FIG. 5 is a detailed diagram of an embodiment of the invention, which corresponds to the diagram in FIG. 4.

In FIG. 5, the elements corresponding to those of the previous figures bear the same references. While the switch in FIG. 4 is symbolic, that of FIG. 5 is an actual mechanical switch, corresponding for example to a channel control knob of a radio transmitter-receiver. It is represented with 12 contacts, but in practice can comprise a much higher multiple of four of them. It is a non-short-circuiting type switch. It is represented with contacts in line in order to save space in the Figure but in reality it is a rotary model whose slider 56 can pass from contact D3 to A1.

Its slider 55 is connected to a supply voltage source of 10 volts, referenced +10. In this case the limit voltages are zero and +10, and the intermediate voltage of 5 volts is referenced +5. The switch contacts are organized in three sets of four contacts: A1, B1, C1, D1 then A2, B2, C2, D2, and finally A3, B3, C3, D3. The contacts referenced by a same letter are connected together as a group and each group is connected to one of the four inputs of an OR gate 52. The contacts A are connected to ground via a capacitor 11 in parallel with a resistor 12, and they are also connected to the input of an inverter 13 whose output is connected via a resistor 14 to the input of a second inverter 16, this input being connected to ground via a capacitor 15. These two inverters in cascade which supply the same logical level as on the input, have the sole object of avoiding switching faults (bounce). The output of the inverter 16 is connected to a first input of a NAND gate 17 whose output is connected to a first input of a NAND gate 18. The second inputs of the two gates 17 and 18 are connected to the output of the OR gate 52. The outputs of the gates 17 and 18 are respectively connected to the input S and the input R of an R/S flip-flop 19. Finally the output of this flip-flop 19 is connected to the anode of a diode 7 whose cathode is connected to the terminal A.

Each of the other three groups of contacts bearing a same letter is connected to the input of a logic group which is identical to the group of elements 11 to 19, a group of elements whose output is connected in the same way via a diode 7B, 7C, 7D to the terminal being referenced by the corresponding letter. The terminals A, B, C, D functionally correspond to those of FIG. 4.

The FIG. 5 embodiment functions as follows: the slider 56 applies a voltage +10 to the contact A1 connected to one input of the OR gate 52 whose output is connected to an input of the gate 17 and is therefore in the high state. The output of the inverter 16 connected to the other inputs of the gate 17 is also in the high state. The output of the gate 17 is therefore in the low state and consequently that of the gate 18 is in the high state. The R/S flip-flop 19 therefore delivers a high state on output, applied to the terminal A.

All the other contacts of the switch being "floating", the inputs of the other logic groups are in the low state, because of the resistors 12B, 12C, 12D. The first inputs of the gates 17B, 17C, 17D are therefore in the low state, so that their outputs, which are respectively connected to the first inputs of the gates 18A, 18B, 18C, are in the high state. As the second inputs of these gates 18 connected to the output of the gate 52 are also in the high state, their outputs are in the low state, and the same applies to the outputs of the following R/S flip-flops. As there is a diode between these outputs and the terminals B, C, D, the latter are not dropped to the low level but taken to the intermediate voltage +5, by means of the resistors 22 which connect each terminal to the +5 voltage source.

Let it now be assumed that the slider 56 leaves the contact A1. During a transient period, all the contacts are floating. Because of the resistors 12, all of the inputs of the gate 52 go to the low state as does its output. The outputs of all of the gates 17 and 18 go to the high state which does not change the state of the R/S flip-flops at all.

When the slider 56 reaches a new contact, B1 or D3, the voltage +10 is again applied to an input of the gate 52. We return to the state explained above, replacing "A" by "B" or "D".

In conclusion: the change to the high state of a terminal only occurs at the moment when the slider touches a contact, and in the meantime the prior state of the terminal is maintained. A voltage is therefore applied at each instant to one and only one terminal, the others being at the intermediate voltage because of the diodes 7 and the resistors 22. An essential condition for the correct functioning of the device is that in no case is it possible to have two terminals together at the high state.

The specified gain operational amplifier AB is in this case constituted by a high gain amplifier looped back to its inverting input by a bridge of resistors 27, 3, whose ratio determines the gain. It is the end of the resistor 3 opposite from the common point of the bridge which constitutes the inverting input of the amplifier AB, while the "+" input of the high gain amplifier directly constitutes the non-inverting input. The other amplifiers BC, CD, DA are identical. The non-inverting input of AB is connected to the terminal A and its inverting input to the terminal B, to which is, in its turn, connected the non-inverting input of BC, and so on, the inverting input of DA finally being connected to the terminal A by the connection 28. The outputs of the four amplifiers are each connected to an input of the transitions detecting circuit 23. Each is connected to a capacitor 50 in series with a resistor 51 connected to ground. Because of the differentiating action of the circuit 50, 51, a short pulse appears at one of the common points of the two elements 50, 51 for each sudden change of output voltage of an amplifier. Each of these common points is connected to the anode of a zener diode 1 and to the cathode of a zener diode 8. The diodes 2 and 9 have the function of blocking the passage of a current in the forward direction of the zener diodes. The references 1, 2, 8, 9 are given only once in order not to clutter the Figure. This threshold voltage of each pair of diodes such as 1, 2 or 8, 9 is chosen between 5 and 10 volts, preferably closer to 5 volts.

All of the zener diodes whose anode is connected by a capacitor to the output of an amplifier have their cathodes connected together by a connection 29 and all of the others have their anodes connected together by a connection 30. Each of these two connections is connected to ground by a resistor, 31 and 32 respectively and via a capacitor, 34 and 33 respectively, to the input of an operational amplifier which functions as a comparator. The "−" input of the amplifier 37 is connected to the connection 29, and the "+" input of the amplifier 40 is connected to the connection 30. Each of these two inputs is also connected via a resistor, 35 and 36 respectively, to the intermediate voltage +5. The "+" input of 37 is connected to a +4 volts bias voltage, and the "−" input of 40 is connected to a voltage of +6 volts. The outputs of 37, 40 are each connected via an inverter, 44 and 45 respectively, to an input, R and S respectively, of an R/S flip-flop 46, 47 whose output is connected to the inputs U/D controlling the direction of counting of the two count-up/count-down counters 48, 49 (corresponding to 25 in FIG. 1). The "−" inputs of two other amplifiers 41, 42, are respectively connected to the outputs of the amplifiers 37, 40, and their "+" inputs are connected to the +4 volts voltage. The outputs of these two other amplifiers are connected together to +5 by a resistor 43 and to the clock input CK of the count-up/count-down counters. In this case decimal counters have been chosen having a so-called "BCD" output. The carry output of the counter 48 is connected to the carry input C of the counter 49. The outputs 26U indicate the units digits and the outputs 26D indicate the tens digits. The counting capacity of the device is therefore one hundred. A switch 57 connects the +5 to the zero reset inputs R of the counters 48 and 49, for a zero reset defining a start position of the object, i.e. the control knob.

When the output of one of the amplifiers AB, BC, CD, DA changes from zero to 10 volts or from 10 volts to zero, a pulse of about ten volts occurs at the common point of one of the resistor-capacitor pairs 50, 51. The zener voltage being about 6 volts, this pulse exceeds the zener voltage by 4 volts, and these 4 volts re-occur on one of the connections 29 or 30 depending on the direction of the pulse. On the other hand, if the output of one of the amplifiers AB, BC, CD, DA changes from zero to 5 volts or from 5 volts to zero, the pulse is too small to exceed the threshold of the zener diodes.

One or other of the big pulses selected by one of the zener diodes is transmitted by one of the capacitors 34 or 33 to one input of one of the amplifiers 37 or 40. The resistors 35 and 36 connected to the +5 provide the rest state bias: in the absence of a pulse the outputs of the two amplifiers are both in the same state, close to the low limit voltage. When a negative pulse arrives on the inverting input of the amplifier 37, its output raises to close to 10 volts. Similarly, when a positive pulse arrives on the non-inverting input of the amplifier 40, its output rises to close to 10 volts. These levels are inverted by the inverters 44 or 45.

This circuit 23 therefore detects the pulses whose amplitude exceeds a certain value, and supplies a signal on one of its two outputs depending on the direction of the pulse.

The R/S flip-flop 46, 47 (which corresponds to 24 in FIG. 1) therefore receives in the rest state a high value on its two inputs, and is set in one of its two states by a negative pulse on one or other of its inputs, which enables the counter 48, 49 to be informed of its direction of counting. Each positive pulse at the output of the amplifiers 37, 40 is also applied to the inverting input of one or other of the amplifiers 41 or 42, which produces a positive output pulse, applied to the clock input CK of the counter: at each transition, whatever its sign may be, a count by one is triggered, in the direction indicated by the input U/D.

Variants are of course possible without departing from the scope of the invention: for example the pulses could be taken to the + and − inputs respectively of the amplifiers 37 and 40, eliminating the inverters 44, 45, adapting the biases, and also inverting the inputs of the amplifiers 41, 42. The diodes 7 and the resistors 22 could also be eliminated taking the +5 volts as the lower supply voltage of the logic elements 13, 16, 17, 18, 19; but the levels obtained would depend on the tolerances of these components, and would be less accurate. It would also be possible to use a single pair of head-to-tail zener diodes, with a single resistor 51 connected to the outputs of the amplifiers AB to DA by four capacitors 50. It has been noted however that the functioning is more certain with four pairs of zener diodes because of differences in transition times of the amplifiers. The connection to the inputs of the comparators 37, 40 could also be made without the capacitors 33, 34 if the comparators were connected between a positive voltage and a negative voltage instead of being connected between ground and a positive voltage.

In the embodiment of the invention which has just been described, the following components have been used successfully:

Gates and inverters 13, 16, 17, 44 to 47: elements of a C-MOS integrated circuit (for example the Philips HEF 4011 or the Motorola MC 14011).

R/S flip-flops 19: elements of an HEF 4044 or MC 14044 circuit.

Amplifiers used in AB, BC, CD, DA: elements of an LM 146 circuit.

Amplifiers 37, 40, 41, 42: elements of an LM 139 circuit.

Count-up/count-down counters 48, 49: MC14510

Capacitors
  11,15: 1nF
  50: 0.1 μF
  33,34: 10nF

Resistors
  14: 1 K.ohms
  12, 22, 51, 31, 32, 3B, 39, 43 = 10 K.ohms
  3, 35, 36: 100 K.ohms
  27: 1 Megohm.

Zener Diode 1,8: BZ X 55C 5V1 diodes 2, 7, 9: 1N4148.

What is claimed is:

1. Device for providing a value indicating the position of an object which can occupy at least three consecutive positions, comprising an arrangement with several terminals each of which corresponds to one of the positions, the application of a DC voltage at each instant to one and only one of said terminals indicating the presence of an object in the corresponding position, characterized in that:

the device comprises a series of operational amplifiers with specified gain, each operational amplifier having an inverting input and a non-inverting input and working over a range of voltages situated between a more positive limit voltage and a more negative limit voltage with respect to an intermediate voltage, and means for taking respective terminals, which do not correspond to the momentary position of the object, to the intermediate voltage, and also characterized in that the difference between said DC voltage on a terminal of the arrangement and the intermediate voltage is large enough for the application of this difference between the two inputs of an amplifier to practically take the output of the latter to one of the limit voltages, and each amplifier has its inverting input connected to one of said terminals corresponding to one position, and its non-inverting input connected to the terminal corresponding to the next position, and the outputs of the amplifiers are connected to a detection circuit for detecting on one of them any transition whose amplitude exceeds a determined threshold and, in response to said detecting, then delivering a signal indicating the direction of the transition; and this signal is used to control a count-up/count-down device whose output value is incremented or decremented on each signal depending on the direction of the transition, this output value constituting an indication of the position of the object.

2. Device according to claim 1, wherein the positions of the object form a closed loop in which the first position follows the last position, and similarly the first terminal follows the last terminal, characterized in that the device comprises an amplifier whose inverting input is connected to the last terminal and whose non-inverting input is connected to the first terminal.

3. Device according to claim 2, the number of positions of the object being a number n which is a multiple of a number j and therefore able to be grouped into j sets of i successive positions, with $i \times j = n$, characterized in that the arrangement comprises only i terminals, each of them corresponding to a same position in each of the j sets, the application of said voltage on one of the i terminals indicating the presence of the object in the corresponding position of any of the j sets.

4. Device according to claim 3, characterized in that $i = 4$.

5. Device according to claim 4, characterized in that the arrangement comprises a rotary non-short-circuiting selector, followed by locking flip-flops ("latches"), whose output is connected each time to one of said terminals.

6. Device according to claim 5, characterized in that the terminals which do not correspond to the position of the object are taken to the intermediate voltage by means of resistors connected between each of the terminals and the intermediate voltage source, associated with diodes connected between each latch output and the corresponding terminal.

7. Device according to claim 3, characterized in that the arrangement comprises a non-short-circuiting rotary selector with n positions, followed by i latches, whose output is connected each time to one of the said terminals.

8. Device according to claim 7, characterized in that the terminals which do not correspond to the position of the object are taken to the intermediate voltage by means of resistors connected between each of the terminals and the intermediate voltage source, associated with diodes connected between each latch output and the corresponding terminal.

9. Device according to claim 8, characterized in that the detection circuit for detecting the transitions has as many inputs as there are terminals; each input is connected via a respective capacitor, said capacitor being connected between one end of a respective resistor whose other end is connected to a reference potential point, and a respective common connection to the cathode of a first zener diode and to the anode of a second zener diode; all of the first diodes have their anodes connected together, their common point being connected to ground via a resistor; and all of the second diodes have their cathodes connected together, their common point being connected to ground via a resistor, the signal indicating the direction of a transition being present in the form of a pulse on one or other of these common points.

10. Device according to claim 9, characterized in that one of said common points is connected via a capacitor to the inverting input of a first comparator, and the other of said common points is connected to the non-inverting input of a second comparator, these comparators being biased such that their outputs are in a same state when in the rest state, these outputs each being connected to one input of an R/S flip-flop which stores the direction of the transition and whose output is applied to the input controlling the direction of counting of the count-up/count-down device.

11. Device according to claim 9, characterized in that the device also comprises a comparator assembly which delivers a pulse when one or another of the common points delivers a signal, the pulse being identical in both cases and applied to the clock input of the count-up/count-down device.

12. Device according to claim 1, characterized in that the detection circuit for detecting the transitions has as many inputs as there are terminals; each input is connected via a respective capacitor, said capacitor being connected between one end of a respective resistor whose other end is connected to a reference potential point, and a respective common connection to the cathode of a first zener diode and to the anode of a second zener diode; all of the first diodes have their anodes connected together, their common point being connected to ground via a resistor; and all of the second diodes have their cathodes connected together, their common point being connected to ground via a resistor, the signal indicating the direction of a transition being present in the form of a pulse on one or other of these common points.

13. Device according to claim 12, characterized in that one of said common points is connected via a capacitor to the inverting input of a first comparator, and the other of said common points is connected to the non-inverting input of a second comparator, these comparators being biased such that their outputs are in a same state when in the rest state, these outputs each being connected to one input of an R/S flip-flop which stores the direction of the transition and whose output is applied to the input controlling the direction of counting of the count-up/count-down device.

14. Device according to claim 12, characterized in that the device also comprises a comparator assembly which delivers a pulse when one or another of the common points delivers a signal, the pulse being identical in both cases and applied to the clock input of the count-up/count-down device.

15. Device according to claim 1, characterized in that the arrangement comprises a rotary non-short-circuiting selector, followed by locking flip-flops ("latches"), whose output is connected each time to one of said terminals.

16. Device according to claim 15, characterized in that the terminals which do not correspond to the position of the object are taken to the intermediate voltage by means of resistors connected between each of the terminals and the intermediate voltage source, associated with diodes connected between each latch output and the corresponding terminal.

17. Device according to claim 1, the number of positions of the object being a number n which is a multiple of a number j and therefore able to be grouped into j sets of i successive positions, with $i \times j = n$, characterized in that the arrangement comprises only i terminals, each of them corresponding to a same position in each of the j sets, the application of said voltage on one of the i terminals indicating the presence of the object in the corresponding position of any of the j sets.

18. Device according to claim 17, characterized in that $i = 4$.

19. A device according to claim 17, characterized in that the arrangement comprises a non-short-circuiting rotary selector with n positions, followed by i latches, whose output is connected each time to one of said terminals.

20. Device according to claim 19, characterized in that the terminals which do not correspond to the position of the object are taken to the intermediate voltage by means of resistors connected between each of the terminals and the intermediate voltage source, associated with diodes connected between each latch output and the corresponding terminal.

* * * * *